(12) United States Patent
Banaszak et al.

(10) Patent No.: US 10,351,679 B2
(45) Date of Patent: Jul. 16, 2019

(54) PROCESS FOR PRODUCING THERMOPLASTIC POLYMER COMPOSITIONS WITH OPTIMIZED DEGREE OF CROSSLINKING

(71) Applicant: INEOS STYROLUTION GROUP GMBH, Frankfurt am Main (DE)

(72) Inventors: Brian J. Banaszak, Mannheim (DE); Roland Walker, Osnabrueck (DE); Libor Seda, Karlovy Vary (CZ); Johannes Barth, Ludwigshafen (DE); Gisbert Michels, Leverkusen (DE); Nikolaus Nestle, Heidelberg (DE)

(73) Assignee: INEOS STYROLUTION GROUP GMBH, Frankfurt am main (DE)

( * ) Notice: Subject to any disclaimer, the term of this patent is extended or adjusted under 35 U.S.C. 154(b) by 0 days.

(21) Appl. No.: 15/560,312

(22) PCT Filed: Mar. 23, 2016

(86) PCT No.: PCT/EP2016/056344
§ 371 (c)(1),
(2) Date: Sep. 21, 2017

(87) PCT Pub. No.: WO2016/150999
PCT Pub. Date: Sep. 29, 2016

(65) Prior Publication Data
US 2018/0066117 A1 Mar. 8, 2018

(30) Foreign Application Priority Data
Mar. 25, 2015 (EP) .................................. 15160878

(51) Int. Cl.
| | | |
|---|---|---|
| *C08J 3/24* | (2006.01) | |
| *C08F 2/26* | (2006.01) | |
| *C08F 2/38* | (2006.01) | |
| *C08F 279/04* | (2006.01) | |
| *C08L 25/12* | (2006.01) | |
| *C08L 55/02* | (2006.01) | |
| *G01R 33/46* | (2006.01) | |

(52) U.S. Cl.
CPC ................ *C08J 3/24* (2013.01); *C08F 2/26* (2013.01); *C08F 2/38* (2013.01); *C08F 279/04* (2013.01); *C08L 25/12* (2013.01); *C08L 55/02* (2013.01); *C08J 2300/22* (2013.01); *G01R 33/46* (2013.01)

(58) Field of Classification Search
CPC .......... C08F 279/04; C08F 2/38; C08L 25/12; C08L 55/02
See application file for complete search history.

(56) References Cited

U.S. PATENT DOCUMENTS

| | | | |
|---|---|---|---|
| 4,634,734 A | 1/1987 | Hambrecht et al. | |
| 4,788,253 A | 11/1988 | Hambrecht et al. | |
| 6,323,279 B1 | 11/2001 | Guntherberg et al. | |
| 2010/0210766 A1* | 8/2010 | Charoensirisomboon | ............... C08F 257/02 524/141 |

FOREIGN PATENT DOCUMENTS

| | | | | |
|---|---|---|---|---|
| DE | 1260135 B | 2/1968 | | |
| DE | 3149358 A1 | 6/1983 | | |
| EP | 0022200 A1 | 1/1981 | | |
| EP | 0993476 B1 | 6/1998 | | |
| GB | 1124911 A | 8/1968 | | |
| GB | 1472195 A | 5/1977 | | |
| JP | 2001011283 A * | 1/2001 | | |
| JP | 2001011283 A | 1/2001 | | |
| WO | 2008/020012 A2 | 2/2008 | | |
| WO | WO-2008020012 A2 * | 2/2008 | ............... C08C 1/07 | |
| WO | 2013/060914 A1 | 5/2013 | | |
| WO | WO-2015086164 A1 * | 6/2015 | ............... C08L 55/02 | |

OTHER PUBLICATIONS

English Machine Translation of JP2001011283 created Sep. 28, 2018. (Year: 2018).*
Rainer Kimmich & Nail Fatkullin "Polymer Chain Dynamics and NMR", Advances in Polymer Science, 170, (2004), pp. 1-113.
Nestle et al., "Towards quanitification of butadiene content in styrene-butadiene block coploymers and their blends with general purpose polystyreme (GPPS) and the relation between mechanical properties and NMR relxation times", Analytica Chemica ACTA, 2007, vol. 604, pp. 54-61.
Kay Saalwachter "Proton multiple-quantum NMR for the study of chain dynamics and structural constraints in polymeric soft materials", Progress in Nuclear Magnetic Resonance Spectroscopy, 51, (2007), pp. 1-35.

(Continued)

*Primary Examiner* — Christopher M Rodd
(74) *Attorney, Agent, or Firm* — J.A. Lindeman & Co. PLLC; Aaron Raphael; Jeffrey Lindeman

(57) ABSTRACT

A process produces a polymer composition (A) containing a styrene copolymer (a) and an impact modifier (b), comprising a copolymer (b1) as graft base and a graft (b2), where the steps of the process are: (1) providing a crosslinked copolymer (b1) made of: (b11) from 70 to 99.99% by weight of a conjugated diene or acrylate, (b12) from 0 to 29% by weight of another comonomer, (b13) from 0 to 10% by weight of crosslinking monomers, and (b14) from 0.01 to 0.7% by weight of a chain-transfer reagent; (2) applying, to the copolymer (b1), at least one graft (b2) comprising: (b21) from 65 to 95% by weight of a vinylaromatic monomer, (b22) from 5 to 35% by weight of acrylonitrile and/or methacrylonitrile, and (b23) from 0 to 30% by weight of monoethylenically unsaturated monomers, thus providing the impact modifier (b); (3) mixing the styrene copolymer (a) and the impact modifier (b), and thus leads to improved mechanical properties of the polymer composition (A).

6 Claims, No Drawings

(56) References Cited

OTHER PUBLICATIONS

English translation of International Preliminary Report on Patentability in International Application No. PCT/EP2016/056344, dated Sep. 28, 2017.

* cited by examiner

PROCESS FOR PRODUCING THERMOPLASTIC POLYMER COMPOSITIONS WITH OPTIMIZED DEGREE OF CROSSLINKING

The invention relates to a process for producing thermoplastic polymer compositions (molding compounds) having an optimized degree of crosslinking. More particularly, the invention concerns a process for producing copolymers, especially graft copolymers, having an optimized degree of crosslinking.

It has been known for decades to produce thermoplastic polymer compositions by modifying thermoplastic polymers through incorporation of elastomers (rubbers) in order to thus obtain impact-modified thermoplastic compositions. This is accomplished for example by graft interpolymerization of styrene and acrylonitrile in the presence of a rubber and also by subsequent blending of this graft copolymer with a separately produced polymeric matrix which may for example consist of a styrene-acrylonitrile copolymer or a methylstyrene-acrylonitrile copolymer.

Elastomers are dimensionally stable, recovering elastically from any deformation. Their glass transition point is below the normal temperature of service. These properties are the result of the individual polymeric chains of the elastomer being linked together by covalent bonds. The polymer is then said to be crosslinked. Its degree of crosslinking is determinative for the properties of the polymer. An increasing degree of crosslinking, in comparable systems, is observed to make the materials stiffer, harder and more resistant to corrosion, but in return also to acquire rather less desirable properties, such as brittleness. Elastomers are polymers having a middling degree of crosslinking, whereas thermoplastics frequently have a low and thermosets a high degree of crosslinking.

The degree of crosslinking is a quantitative measure for characterizing polymeric networks. It is for example computed as the quotient formed by dividing the moles of crosslinked basic building blocks by the moles of all the basic building blocks present in this macromolecular product (network).

The degree of crosslinking is reported either as a dimensionless number or in percent (amount-of-substance fraction). The degree of crosslinking must not be confused with the crosslink density of a polymer: the number of crosslinks per unit volume.

A polymer's maximum degree of crosslinking is derivable from the formulation for the polymeric network. This maximum degree of crosslinking represents a theoretical degree of crosslinking, as it is almost never attained in practice, since during the polymerization (network formation), not all the building blocks capable of crosslinking actually find an entity to react with, inter alia because of steric hindrance, and the rest of the reaction conditions may also affect the crosslinking.

The theoretical degree of crosslinking computes from the composition of the monomer mixture. The actually attained degree of crosslinking is analytically determinable, for example via spectroscopic methods, such as NMR spectroscopy (cf. K. Saalwachter, Progress in Nuclear Magnetic Resonance Spectroscopy, 2007, 51, pp. 1-35; R. Kimmich, N. Fatkullin, Advances in Polymer Science, 2004, 170, pp. 1-113), after the polymerization.

WO 2013/060914 relates to the characterization of an elastomeric latex via low-field NMR spectroscopy. Double quantum coherence spectroscopy is used therein to study natural rubber latices for their network structure as the natural rubber undergoes various processing operations.

Analytica Chimica Acta, vol. 604, 2007, pages 54-61 describes the study of styrene-butadiene-styrene block copolymers via low-field time domain NMR spectroscopy.

To be able to produce elastomers having specific properties in a planful manner, therefore, the process for producing crosslinked polymers must be precisely controllable. Since a large number of factors affect the crosslinking reactions, this may be accomplished in various ways, for example by controlling the reaction temperature or by admixing molecular weight regulators such as, for example, crosslinking agents and chain transfer agents.

Molecular weight regulators of this type are typically added to polymerization mixtures in an amount of 0 to 3 wt %. Especially chain transfer agents frequently constitute a factor which should be reduced in view of the noxiant content of the plastics and undesirable properties.

It is the shear diversity of influences on the degree of crosslinking of a polymer during the polymerization reaction which makes regulating the degree of crosslinking in manufactured elastomers problematic. Not only the reactants influence the properties, but also the additives, the reaction time, the reaction temperature and further parameters such as the degree of branching. It therefore appears necessary to provide a process enabling the degree of crosslinking of an elastomeric component to be determined and the polymerization process to be adapted thereto in order thus to obtain polymers having optimized properties. A reduction in the amount of chain transfer agents to be admixed should further also be obtained.

It is an object of the present invention to provide a process capable of producing a polymer composition having optimized mechanical properties while employing a low level of chain transfer agent. We have found that this object is achieved by the process described hereinafter.

One subject of the invention is a process for producing a thermoplastic polymer composition (A) containing at least one styrene copolymer (a) and at least one polymeric impact modifier (b) comprising a copolymer (b1) as graft substrate and at least one graft superstrate (b2) and optionally also further additives (C). The process comprises the steps of:
  (1) providing a crosslinked copolymer (b1) by polymerizing a monomer mixture comprising:
    (b11): 70 to 99.99 wt % of at least one conjugated diene and/or of at least one acrylate,
    (b12): 0 to 29 wt % of at least one further comonomer selected from: styrene, α-methylstyrene, acrylonitrile, methacrylonitrile, and methyl methacrylate,
    (b13): 0 to 10 wt % of one or more polyfunctional crosslinking monomers, and
    (b14): 0.01 to 0.7 wt % of a chain transfer agent,
    based on the entire monomer quantity of the polymerization mixture for producing said copolymer (b1);
  (2) applying at least one graft superstrate (b2) on said copolymer (b1) by polymerizing a monomeric mixture comprising:
    (b21): 65 to 95 wt % of at least one vinylaromatic monomer,
    (b22): 5 to 35 wt % of acrylonitrile and/or methacrylonitrile, and
    (b23): 0 to 30 wt % of at least one further monoethylenically unsaturated monomer selected from: methyl methacrylate (MMA), maleic anhydride (MA) and N-phenylmaleimide (N-PMI), based on the entire monomer quantity of the polymerization mixture for producing said graft superstrate (b2),
in the presence of said copolymer (b1) as graft substrate to obtain said impact modifier (b); and
(3) blending the at least one styrene copolymer (a) and the at least one impact modifier (b) to obtain said polymer composition (A).

The invention also provides a process wherein the concentration of chain transfer agent (b14) is from 0.1 to 0.6 wt %, based on the entire monomer quantity of the polymerization mixture for producing said copolymer (b1).

The invention also provides a process wherein said copolymer (b1) is provided by admixing the reaction mixture of the polymerization reaction with a chain transfer agent (b14) from the group comprising mercaptans, phosphinates, bisulfites, terpinols and dimeric α-methylstyrene and mixtures thereof.

The invention also provides a process wherein said copolymer (b1) is provided by admixing the reaction mixture of the polymerization reaction with an additional polyfunctional crosslinking monomer (b13) in the form of at least one bifunctional monomer having two or more reactive unsaturated groups from the group comprising ethylene glycol diacrylate, butanediol diacrylate, hexanediol diacrylate, ethylene glycol dimethacrylate, butanediol dimethacrylate, hexanediol dimethacrylate, divinylbenzene, diallyl maleate, diallyl fumarate, diallyl phthalate, diallyl cyanurate, triallyl cyanurate, tricyclodecenyl acrylate, dihydrodicyclopentadienyl acrylate, diallyl phosphate, allyl acrylate, allyl methacrylate (AMA), dicyclopentadienyl acrylate (DCPA) and mixtures thereof.

The invention further provides a thermoplastic polymer composition (A) obtained or obtainable by the process described.

The invention also provides a polymer composition (A) which contains a styrene/acrylonitrile copolymer (SAN) as styrene copolymer (a) and also a butadiene-containing copolymer or an acrylate-containing copolymer as polymeric impact modifier (b).

The invention further provides the method of using the thermoplastic polymer composition (A) in the manufacture of moldings, sheetings or coatings.

The invention also provides a process for optimizing the degree of crosslinking (V) of a crosslinked copolymer (b1) as graft substrate for a polymeric impact modifier (b) produced from a monomer mixture comprising:
(b11): 70 to 99.99 wt % of at least one conjugated diene and/or of at least one acrylate,
(b12): 0 to 29 wt % of at least one further comonomer selected from: styrene, α-methylstyrene, acrylonitrile, methacrylonitrile, and methyl methacrylate,
(b13): 0 to 10 wt % of one or more polyfunctional crosslinking monomers, and
(b14): 0.01 to 0.7 wt % of a chain transfer agent,
based on the entire monomer quantity of the polymerization mixture for producing said copolymer (b1);
wherein the process comprises the steps of:
(i) polymerizing the monomer mixture for producing said copolymer (b1);
(ii) determining via NMR relaxation measurements the degree of crosslinking (V) of said copolymer (b1) obtained in step (i);
(iii) polymerizing a modified monomer mixture to produce a modified copolymer (b1'), wherein the parameters of the polymerization reaction are adapted according to said degree of crosslinking (V) determined as per step (ii) for said copolymer (b1) and according to the desired degree of crosslinking (V') of said copolymer (b1') as graft substrate; and
(iv) repeating said steps (i) to (iii) as often as necessary until a desired degree of crosslinking (V') is obtained.

The invention further provides a process wherein the transversal relaxation time T2 is used to determine said degree of crosslinking (V) of said copolymer (b1).

The invention also provides a process wherein said degree of crosslinking (V) of said copolymer (b1) is determined by using a low-field NMR spectrometer at a field strength ranging from 0.001 to 1.5 teslas, preferably from 0.1 to 0.6 tesla.

The invention also provides a process wherein the step of providing said copolymer (b1') according to said degree of crosslinking (V) determined in step (ii) for said copolymer (b1) resulting from the first polymerization reaction is carried out by admixing the reaction mixture of the polymerization mixture as per step (iii) additionally with a polyfunctional crosslinking monomer (b13) as crosslinking agent and/or a chain transfer agent (b14), or changing the reaction temperature in the polymerization reaction, or a combination thereof.

The invention also provides a process wherein the step of providing said copolymer (b1') is carried out by subjecting the reaction mixture of the polymerization reaction to a temperature change of not less than 10° C.

The invention also provides a process wherein the reaction mixture has added to it a chain transfer agent in a concentration of 0.1 to 0.6 wt %, based on the entire monomer quantity of the polymerization mixture for producing said copolymer (b1').

The invention further provides the method of using the process as claimed in any one of claims 8 to 13 in the manufacture of a copolymer (b1') having an optimized degree of crosslinking (V').

The thermoplastic polymer composition (A) preferably consists of the polymeric components (a) and (b):
(a): 30 to 95 wt %, based on the polymer composition (A), of at least one styrene copolymer (a) having a weight average molar mass Mw of 150 000 to 360 000 g/mol, selected from vinylaromatic copolymers selected from the group consisting of:
styrene-acrylonitrile copolymers, α-methylstyrene-acrylonitrile copolymers, styrene-maleic anhydride copolymers, styrene-phenylmaleimide copolymers, styrene-methyl methacrylate copolymers, styrene-acrylonitrile-maleic anhydride copolymers, styrene-acrylonitrile-phenylmaleimide copolymers, α-methyl-styrene-acrylonitrile-methyl methacrylate copolymers, α-methylstyrene-acrylonitrile-t-butyl methacrylate copolymers and styrene-acrylonitrile-t-butyl methacrylate copolymers,
(b): 5 to 70 wt %, based on the polymer composition (A), of at least one impact modifier (b) consisting of:
(b1): 20-90 wt %, based on the impact modifier (b), of a copolymer of one or more monomers as graft substrate obtained by copolymerizing a monomer mixture comprising:
(b11): 70 to 99.99 wt % of at least one conjugated diene and/or of at least one acrylate,
(b12): 0 to 29 wt % of at least one further comonomer selected from: styrene, α-methylstyrene, acrylonitrile, methacrylonitrile, and methyl methacrylate,
(b13): 0 to 10 wt % of one or more polyfunctional crosslinking monomers, and (b14): 0.01 to 0.7 wt % of a chain transfer agent, based on the entire monomer quantity of the polymerization mixture for producing said copolymer (b1);

(b2): 10 to 80 wt %, based on the impact modifier (b), of a graft superstrate of one or more monomers consisting of:
(b21): 65 to 95 wt %, preferably 70 to 90 wt %, more preferably 75 to 85 wt % of at least one vinylaromatic monomer, preferably styrene and/or α-methylstyrene, especially styrene,
(b22): 5 to 35 wt %, preferably 10 to 30 wt %, more preferably 15 to 25 wt % of acrylonitrile and/or methacrylonitrile, preferably acrylonitrile, and
(b23): 0 to 30 wt %, preferably 0 to 20 wt %, more preferably 0 to 15 wt % of at least one further monoethylenically unsaturated monomer selected from: MMA, MA and N-PMI,
based on the entire monomer quantity of the polymerization mixture for producing said graft superstrate (b2);

wherein styrene copolymer (a) and impact modifier (b) sum to 100 wt %.

The viscosity (as measured to ISO 11443) of polymer composition (A) at shear rates of 1 to 10 s$^{-1}$ and at temperatures of 250° C. is preferably not more than 1×10$^5$ Pa*s.

The melt volume rate (MVR, measured to ISO 1133 at 220° C. and 10 kg load) is preferably more than 6 ml/10 min.

The weight average molar mass Mw is determined via known methods of GPC with UV detection.

The proportion of thermoplastic polymer composition (A) that is attributable to polymer (a) and to impact modifier (b) is from 40 to 90 wt % and from 60 to 10 wt % respectively.

More preferably, the proportion of polymer composition (A) that is attributable to polymer (a) and to impact modifier (b) is from 50 to 80 wt % and from 50 to 20 wt % respectively. Especially the proportion of polymer composition (A) that is attributable to polymer (a) and to impact modifier (b) is from 60 to 75 wt % and from 40 to 25 wt % respectively.

Styrene Copolymer (a)

The styrene copolymer (a) constitutes a hard phase having a glass transition temperature Tg of >20° C. The weight average molar masses Mw of styrene copolymers (a) are typically in the range from 150 000 to 360 000 g/mol, preferably in the range from 150 000 to 300 000 g/mol, more preferably in the range from 150 000 to 270 000 g/mol, yet more preferably in the range from 150 000 to 250 000 g/mol and especially in the range from 150 000 to 220 000 g/mol.

Styrene copolymer (a) as used for the purposes of the invention comprises vinylaromatic copolymers selected from the group consisting of styrene-acrylonitrile copolymers, α-methylstyrene-acrylonitrile copolymers, styrene-maleic anhydride copolymers, styrene-phenylmaleimide copolymers, styrene-methyl methacrylate copolymers, styrene-acrylonitrile-maleic anhydride copolymers, styrene-acrylonitrile-phenylmaleimide copolymers, α-methylstyrene-acrylonitrile-methyl methacrylate copolymers, α-methylstyrene-acrylonitrile-t-butyl methacrylate copolymers and styrene-acrylonitrile-t-butyl methacrylate copolymers.

The aforementioned polymers (a) are preferably amorphous polymers. Particular preference for use as styrene copolymer (a) is given to styrene-acrylonitrile copolymers (SAN), styrene-methyl methacrylate copolymers (SMMA), and/or styrene-maleic anhydride copolymers (SMA). Preference is given to styrene-acrylonitrile copolymers (SAN).

SAN copolymers and α-methylstyrene-acrylonitrile copolymers (AMSAN) used as styrene copolymer (a) in the present invention contain in general from 18 to 35 wt %, preferably from 20 to 32 wt % and more preferably from 22 to 30 wt % of acrylonitrile (AN) and from 82 to 65 wt %, preferably from 80 to 68 wt % and more preferably from 78 to 70 wt % of styrene (S) or, respectively, α-methylstyrene (AMS), subject to the proviso that the sum total of styrene/α-methylstyrene and acrylonitrile adds up to 100 wt %.

The SAN and AMSAN copolymers used generally have a weight average molar mass Mw of 150 000 to 350 000 g/mol, preferably 150 000 to 300 000 g/mol, more preferably 150 000 to 250 000 g/mol and most preferably 150 000 to 200 000 g/mol.

SMMA copolymers used as styrene copolymer (a) for the purposes of the present invention contain in general from 18 to 50 wt %, preferably from 20 to 30 wt % of methyl methacrylate (MMA) and from 50 to 82 wt %, preferably from 80 to 70 wt % of styrene subject to the proviso that the sum total of styrene and MMA adds up to 100 wt %.

SMSA copolymers used as styrene copolymer (a) for the purposes of the present invention contain in general from 10 to 40 wt % and preferably from 20 to 30 wt % of maleic anhydride (MA) and from 60 to 90 wt % and preferably from 80 to 70 wt % of styrene subject to the proviso that the sum total of styrene and MA adds up to 100 wt %.

The styrene copolymer (a) has a viscosity number VN (determined to DIN 53 726 at 25° C. on a 0.5 wt % solution of polymer (A) in dimethylformamide) of 50 ml/g to 120 ml/g, preferably 52 ml/g to 100 ml/g and more preferably 55 ml/g to 80 ml/g.

The styrene copolymers (a) are obtained in the known manner by bulk, solution, suspension, precipitation or emulsion polymerization, of which bulk polymerization and solution polymerization are preferable. Details of these processes are described for example in Kunststoffhandbuch, eds. R. Vieweg and G. Daumiller, volume 4 "Polystyrol", Carl-Hanser-Verlag Munich 1996, p. 104 ff and also in "Modern Styrenic Polymers: Polystyrenes and Styrenic Copolymers" (eds., J. Scheirs, D. Priddy, Wiley, Chichester, UK, (2003), pages 27 to 29) and in GB-A 1472195.

Useful SAN copolymers include commercially available SAN copolymers such as, for example, Luran® from Styrolution (Frankfurt). Preference is given to using SAN copolymers having an S/AN ratio (in weight percent) of 81/19 to 67/33 and an MVR (measured to ISO 1133 at 220° C. and 10 kg load) of not less than 10 ml/10 min, e.g., Luran 368.

Polymeric Impact Modifier (b)

The impact modifier (b) constitutes a soft phase having a glass transition temperature TG of <0° C., preferably <−20° C., more preferably <−40° C.

The particle size of impact modifiers (b) is generally not less than 50 nm and not more than 8 μm, preferably in the range from 60 nm to 5 μm, more preferably in the range from 80 nm to 3 μm and most preferably in the range from 80 nm to 2 μm. Impact modifiers (b) of the present invention are obtainable with bi-, tri- or multimodal particle size distributions.

The impact modifier (b) in the present invention often contains:
(b1): 20 to 90 wt %, preferably 40 to 90 wt %, more preferably 45 to 85 wt % and most preferably 50 to 80 wt % of a copolymer of one or more monomers as graft substrate obtained by copolymerizing a monomer mixture comprising:

(b11): 70 to 99.99 wt % of at least one conjugated diene and/or of at least one acrylate, (b12): 0 to 29 wt % of at least one further comonomer selected from: styrene, α-methylstyrene, acrylonitrile, methacrylonitrile, and methyl methacrylate, (b13): 0 to 10 wt % of one or more polyfunctional crosslinking monomers, and (b14): 0.01 to 0.7 wt % of a chain transfer agent, based on the entire monomer quantity of the polymerization mixture for producing said copolymer (b1);

(b2): 10 to 80 wt %, preferably 10 to 60 wt %, more preferably 15 to 55 wt % and most preferably 20 to 50 wt % of a graft superstrate of one or more monomers consisting of:

(b21): 65 to 95 wt %, preferably 70 to 90 wt %, more preferably 75 to 85 wt % of at least one vinylaromatic monomer, preferably styrene and/or α-methylstyrene, especially styrene, (b22): 5 to 35 wt %, preferably 10 to 30 wt %, more preferably 15 to 25 wt % of acrylonitrile and/or methacrylonitrile, preferably acrylonitrile, and (b23): 0 to 30 wt %, preferably 0 to 20 wt %, more preferably 0 to 15 wt % of at least one further monoethylenically unsaturated monomer selected from: MMA, MA and N-PMI, preferably MMA, based on the entire monomer quantity of the polymerization mixture for producing said graft superstrate (b2).

Useful conjugated dienes (b11) include dienes having 4 to 8 carbon atoms such as butadiene, isoprene, piperylene and chloroprene or mixtures thereof. Preference is given to using butadiene or isoprene or mixtures thereof, most preferably butadiene.

Copolymers (b1) based on conjugated dienes (b11) include, for example, copolymers of the aforementioned conjugated dienes (b11) with each or one another, copolymers of such dienes with acrylates (b11), especially n-butyl acrylate, and copolymers of such dienes with the comonomers (b12) selected from styrene, α-methylstyrene, acrylonitrile, methacrylonitrile and methyl methacrylate which were produced in the presence of a chain transfer agent (b14) in the stated amount.

The diene polymers may also contain additional crosslinking polyfunctional monomers (b13). Examples thereof are monomers containing two or more copolymerization-capable double bonds such as ethylene glycol diacrylate, butanediol diacrylate, hexanediol diacrylate, ethylene glycol dimethacrylate, butanediol dimethacrylate, hexanediol dimethacrylate, divinylbenzene, diallyl maleate, diallyl fumarate, diallyl phthalate, diallyl cyanurate, trisallyl cyanurate, esters of tricyclodecenyl alcohol such as tricyclodecenyl acrylate, dihydrodicyclopentadienyl acrylate, diallyl phosphate, allyl acrylate, allyl methacrylate and dicyclopentadienyl acrylate (DCPA). Preference is given to using esters of tricyclodecenyl alcohol, divinylbenzene, allyl (meth)acrylate and/or trisallyl cyanurate. Preferred diene polymers are commercially available butadiene, butadiene-styrene, butadiene-methyl methacrylate, butadiene-n-butyl acrylate, butadiene-acrylonitrile and acrylonitrile-butadiene-styrene copolymers (ABS); particular preference is given to ABS copolymers.

Such preferred diene copolymers (b1) and ABS impact modifiers (b) are described in EP 0 993 476.

Copolymers (b1) based on acrylates are generally alkyl acrylate polymers formed from one or more C4-C8 alkyl acrylates, preferably butyl, hexyl, octyl or 2-ethylhexyl acrylate being used in part at least. These alkyl acrylate copolymers may contain up to 29 wt % of monomers such as styrene, α-methylstyrene, acrylonitrile, methacrylonitrile and methyl methacrylate in polymerized form which form hard polymers.

The aforementioned impact modifiers (b) are preferably acrylonitrile-butadiene-styrene (ABS) and/or acrylonitrile-styrene-acrylate (ASA) copolymers.

Acrylonitrile-styrene-acrylate copolymers (ASA) are a preferred embodiment. The acrylate copolymers further contain up to 10 wt %, preferably from 1 to 5 wt % of crosslinking polyfunctional monomers (b13) (crosslinking monomers). Examples thereof are monomers containing two or more copolymerization-capable double bonds such as ethylene glycol diacrylate, butanediol diacrylate, hexanediol diacrylate, ethylene glycol dimethacrylate, butanediol dimethacrylate, hexanediol dimethacrylate, divinylbenzene, diallyl maleate, diallyl fumarate, diallyl phthalate, diallyl cyanurate, trisallyl cyanurate, esters of tricyclodecenyl alcohol such as tricyclodecenyl acrylate, dihydrodicyclopentadienyl acrylate, diallyl phosphate, allyl acrylate, allyl methacrylate and dicyclopentadienyl acrylate (DCPA). Preference is given to using esters of tricyclodecenyl alcohol, divinylbenzene, allyl (meth)acrylate and/or trisallyl cyanurate.

The impact modifier (b) produced according to the invention is more preferably an ABS impact modifier (b) comprising (b1): 40 to 90 wt %, based on the impact modifier (b), of a graft substrate consisting of:

(b11): 70 to 99.99 wt %, preferably 90 to 99.89 wt % of butadiene, (b12): 0 to 29 wt %, preferably 1 to 10 wt % of styrene, and (b14): 0.01 to 0.7 wt % of a chain transfer agent, based on the entire monomer quantity of the polymerization mixture for producing the copolymer (b1); and (b2): 10 to 60 wt %, based on the impact modifier (b), of a graft superstrate consisting of:

(b21): 65 to 95 wt % of styrene, (b22): 5 to 35 wt % of acrylonitrile, and (b23): 0 to 30 wt % of MMA, based on the entire monomer quantity of the polymerization mixture for producing the graft superstrate (b2).

The soft component is preferably a multistagedly constructed copolymer having a core-shell construction and a core-shell morphology. For example, a rubberily elastic core (glass transition temperature TG<50° C.) may be enveloped by a "hard" shell (polymers with TG>50° C.), or vice versa. Core-shell graft copolymers of this type are known.

Production of Impact Modifiers (b)

Processes for producing the impact modifiers (b) are conceptually known to the notional person skilled in the art and are described in the literature. Some products of this type are commercially available. Emulsion polymerization has proved to be particularly advantageous for the process of production (DE-C 12 60 135 and EP 0 993 476 B1). The production of impact modifiers (b) generally comprises producing a copolymer (b1) as graft substrate and producing a graft superstrate (b2).

Production of Copolymer (b1)

The polymerization temperature is typically in the range from 20 to 100° C. and preferably in the range from 30 to 80° C. Customary emulsifiers are generally also used, examples being alkali metal salts of alkyl- or alkylarylsulfonic acids, alkyl sulfates, fatty alcohol sulfonates, salts of higher fatty acids having 10 to 30 carbon atoms, sulfosuccinates, ether sulfonates or resin soaps. Preference is given to using the alkali metal salts, especially the sodium and potassium salts, of alkylsulfonates or fatty acids having 10 to 18 carbon atoms.

The amounts in which the emulsifiers are used are generally in the range from 0.5 to 5 wt % and especially in the range from 0.5 to 3 wt %, based on the monomers used in the production of copolymer (b1).

The amount of water used for producing the dispersion is preferably such that the final dispersion has a solids content of 20 to 50 wt %. A water/monomer ratio in the range from 2:1 to 0.7:1 is typically used.

The polymerization reaction can be suitably initiated using any free-radical generators which decompose at the reaction temperature chosen, i.e., not only those which decompose thermally on their own but also those which decompose thermally in the presence of a redox system. The polymerization initiators used are preferably free-radical generators, for example peroxides such as, preferably, peroxosulfates (sodium persulfate or potassium persulfate, say) and azo compounds such as azodiisobutyro-nitrile. However, it is also possible to use redox systems, especially redox systems based on hydroperoxides such as cumene hydroperoxide.

The polymerization initiators are generally used in an amount of 0.1 to 1 wt %, based on the graft substrate monomers (b11) and (b12). The polymerization initiators are preferably used in an amount of 0.1 to 0.5 wt % based on the entire monomer quantity of the polymerization mixture, especially in an amount of 0.2 to 0.4 wt % based on the entire monomer quantity of the polymerization mixture for producing copolymer (b1).

The free-radical generators and also the emulsifiers are added to the reaction batch for example batchwise by adding the overall quantity at the start of the reaction, or by being subdivided into a plurality of portions which are added at the start and at one or more subsequent junctures, or continuously during a specified time interval.

The continuous addition process can also follow a gradient, which may for example be upwardly or downwardly inclined, linear or exponential, or else may be a stepped gradient (step function).

Chain transfer agents are used in a concentration of less than 0.75 wt %, especially less than 0.7 wt %, based on the entire monomer quantity used. The chain transfer agents are preferably used in an amount ranging from 0.01 to 0.7 wt %, preferably in an amount ranging from 0.1 to 0.6 wt %, especially in an amount ranging from 0.2 to 0.6 wt %, based on the entire monomer quantity used for producing copolymer (b1). Particular preference is given to an admixture in an amount ranging from 0.3 to 0.6 wt % and especially from 0.4 to 0.55 wt %, based on the entire monomer quantity.

Suitable chain transfer agents include, for example, mercaptans, phosphinates, bisulfites, terpinols and dimeric α-methylstyrene, especially mercaptomethanol, ethylhexyl thioglycolate, n-dodecyl mercaptan, t-dodecyl mercaptan, mercaptopropionic acid, bis-(isopropylxanthogen) disulfite, sodium hypophosphite (NHP) and mixtures thereof.

Particular preference is given to using t-dodecyl mercaptan as chain transfer agent in an amount ranging from 0.01 to 0.7 wt %, preferably in an amount ranging from 0.1 to 0.6 wt %, especially in an amount ranging from 0.2 to 0.6 wt %, based on the entire monomer quantity used for producing copolymer (b1). Particular preference is given to an admixture of t-dodecyl mercaptan in an amount ranging from 0.3 to 0.6 wt % and especially from 0.4 to 0.55 wt %, based on the entire monomer quantity.

It is further possible to admix additional polyfunctional crosslinking monomers as crosslinking agents in an amount of 0 to 10 wt %.

Suitable crosslinking agents include, for example, ethylene glycol diacrylate, butanediol diacrylate, hexanediol diacrylate, ethylene glycol dimethacrylate, butanediol dimethacrylate, hexanediol dimethacrylate, divinylbenzene, diallyl maleate, diallyl fumarate, diallyl phthalate, diallyl cyanurate, trisallyl cyanurate, esters of tricyclodecenyl alcohol such as tricyclodecenyl acrylate, dihydrodicyclopentadienyl acrylate, diallyl phosphate, allyl acrylate, allyl methacrylate and dicyclopentadienyl acrylate (DCPA) and mixtures thereof. Preference is given to using esters of tricyclodecenyl alcohol, divinylbenzene, allyl (meth)acrylate and/or trisallyl cyanurate.

The chain transfer agents and crosslinking agents are added to the reaction batch in a batchwise or continuous manner as described above for the free-radical generators and emulsifiers. The amount in which and the time at which molecular weight regulators are admixed are preferably chosen according to the degree of crosslinking desired from the polymerization. Batchwise admixture is preferred. For example, admixture is effected in from 1 to 7 steps, preferably in from 2 to 5 steps and especially in 3 or 4 steps.

The time of admixture is freely choosable in principle. Preferably, the first admixture of chain transfer agents and/or crosslinking agents takes place once from about 10 to 20% of the entire reaction time from the start of the polymerization has elapsed, especially once from about 12 to 16% of the reaction time has elapsed, more preferably once from about 13 to 14% of the reaction time has elapsed.

The second admixture of chain transfer and/or crosslinking agents preferably takes place once from about 45 to 55% of the entire reaction time from the start of the polymerization has elapsed, especially once from about 49 to 53% of the reaction time has elapsed, more preferably once from about 50 to 52% of the reaction time has elapsed. The third admixture of chain transfer and/or crosslinking agents preferably takes place once from about 90 to 100% of the entire reaction time from the start of the polymerization has elapsed, especially once from about 95 to 99.5% of the reaction time has elapsed, more preferably once from about 97 to 99% of the reaction time has elapsed.

The polymerization time is in the range from 1 minute to 20 hours, especially in the range from 1 hour to 16 hours and preferably in the range from 4 hours to 12 hours.

The admixture scheme resulting in the case of an exemplary overall reaction time of 8.5 hours is for example as follows: the first admixture of chain transfer and/or crosslinking agents preferably takes place at from 50 to 90 minutes from the start of the polymerization, especially after 60 to 80 minutes and more preferably after 65 to 75 minutes. The second admixture of chain transfer and/or crosslinking agents preferably takes place at from 240 to 280 minutes from the start of the polymerization, especially after 250 to 270 minutes and more preferably after 255 to 265 minutes. The third admixture of chain transfer and/or crosslinking agents preferably takes place at from 480 to 510 minutes from the start of the polymerization, especially after 490 to 510 minutes and more preferably after 495 to 505 minutes.

The admixed amount of chain transfer and/or crosslinking agent in every admixing step may be the same and correspond to a uniform proportion of the entire amount admixed. Preferably, however, more chain transfer and/or crosslinking agent is admixed in the first admixing step than in the last admixing step. For example, in an admixture scheme of three admixing steps, about 35 to 45 wt % of the total quantity of chain transfer and/or crosslinking agent is admixed in both the first and second admixing steps, while about 10 to 30 wt % of the total amount of chain transfer and/or crosslinking agent is admixed in the third admixing step.

Buffering substance such as $Na_2HPO_4/NaH_2PO_4$, sodium bicarbonate or buffers based on citric acid/citrate may be used to maintain a consistent pH, which is preferably in the range from 6 to 9. Regulators and buffering substances are used in the customary amounts, so there is no need for more particular indications in this regard.

In one particular embodiment, copolymer (b1) is also obtainable by polymerizing the monomers (b11) to (b13) in the presence of chain transfer agent (b14) and of a finely divided latex (in the so-called "seed latex mode" of the polymerization process).

This latex is initially charged and may consist of monomers forming rubberily elastic polymers or else of other monomers as already recited. Suitable seed latices consist, for example, of polybutadiene or polystyrene. Seed latices are more preferably of polystyrene.

In another preferred embodiment, copolymer (b1) is obtainable in the so-called feed stream addition process. In this process, a certain proportion of monomers (b11) to (b13) and of chain transfer agent (b14) is initially charged and the polymerization is initiated, whereupon the rest of monomers (b11) to (b13) and, as the case may be, of chain transfer agent (b14) (the "feed stream addition portion") is added as a feed stream during the polymerization.

The feed stream addition parameters (gradient shape, amount, duration, etc.) depend on the other polymerization conditions. Again, the remarks made regarding the admixture method for the free-radical starter and/or emulsifier apply here mutatis mutandis. The initially charged proportion of the monomers for producing (b1) in the feed stream addition process is preferably in the range from 5 to 50, more preferably 8 to 40 wt %, based on (b1). The feed stream addition portion of (b11) to (b13) is preferably added over 1 to 18 hours, especially 2 to 16 hours, more preferably 4 to 12 hours.

The precise conditions for the polymerization, especially the type, amount and dosage regime of the emulsifier and of the other polymerization assistants are preferably chosen such that the latex obtained for impact modifier (b) has an average particle size, defined by the d50 value of the particle size distribution, in the range from 80 to 1000 nm, preferably in the range from 85 to 600 nm and more preferably in the range from 90 to 500 nm.

The reaction conditions for the polymerization of copolymer (b1) are typically chosen so as to obtain a graft substrate in a specified crosslinked state. Essential parameters therefor are the reaction temperature and duration, the ratio of monomers, regulators, free-radical initiators and, in the feed stream addition process for example, the feed stream addition rate and the amount and timing for the admixture of regulator and initiator. As to the precise procedure, reference is made to the hereinbelow following description of the process for optimizing the degree of crosslinking.

The reaction conditions may be aligned such that the polymer particles have a bimodal type of particle size distribution, i.e., a size distribution having two more or less defined maxima. The first maximum is more distinctly defined (as a comparatively narrow peak) than the second maximum and is generally located at from 25 to 200 nm, preferably at from 60 to 170 nm and more preferably at from 70 to 150 nm. The second maximum is comparatively broad and generally locates at from 150 to 800 nm, more preferably at from 180 to 700 nm and more preferably at from 200 to 600 nm. The second maximum (150 to 800 nm) is located at larger particle sizes than the first maximum (25 to 200 nm).

The bimodal type of particle size distribution is preferably achieved via a (partial) agglomeration of the polymer particles. A possible procedure for this is for example as follows: Monomers (b11) to (b13) are polymerized in the presence of chain transfer agent (b14), which construct the core, up to a conversion of typically not less than 90%, preferably above 95%, based on the monomers used. This conversion is generally reached after 4 to 20 hours. The polymer latex obtained has an average particle size d50 of not more than 200 nm and a narrow particle size distribution (it is a nearly monodisperse system).

The polymer latex is agglomerated in the second stage. This is generally accomplished by admixing a dispersion of an acrylic ester polymer. Preference is given to using dispersions of copolymers of C1-C4 alkyl esters of acrylic acid, preferably of ethyl acrylate, with from 0.1 to 10 wt % of monomers forming polar polymers, e.g., acrylic acid, methacrylic acid, acrylamide, methacrylamide, N-methylolmethacrylamide or N-vinylpyrrolidone. A copolymer formed from 96% ethyl acrylate and 4% methacrylamide is particularly preferable. The agglomerating dispersion may optionally also contain a plurality of the acrylic ester polymers referred to.

The concentration of acrylic ester polymers in the dispersion used for agglomeration shall generally be between 3 and 40 wt %.

Agglomeration utilizes from 0.2 to 20, preferably 1 to 5 parts by weight of the agglomerating dispersion per 100 parts of the polymer latex, all reckoned on solids. The agglomeration is carried out by admixing the agglomerating dispersion to the polymer. The rate of admixing is normally not critical, it generally takes about 1 to 30 minutes at a temperature between 20 and 90° C., preferably between 30 and 75° C.

Aside from using an acrylic ester polymer dispersion, the polymer latex may also be agglomerated with other agglomerating agents such as, for example, acetic anhydride.

Agglomeration is also possible by pressure or freezing (making for a pressure agglomeration and a freeze agglomeration, respectively). The methods referred to are known to a person skilled in the art.

Under the conditions referred to, only a portion of the polymer particles is agglomerated, resulting in a bimodal distribution. Following the agglomerating step, generally more than 50% and preferably between 75% and 95% of the particles (number-based distribution) is in a nonagglomerated state. The partially agglomerated polymer latex obtained is comparatively stable, so it is readily storable and transportable without occurrence of coagulation.

To obtain a bimodal type of particle size distribution for impact modifier (b), it is also possible to produce two different impact modifiers (b) and (b*), which differ in their average particle size, separately from each other in the usual manner and to add the impact modifiers (b) and (b*) together in the desired mixing ratio.

Production of Graft Superstrate (b2)

Graft superstrate (b2) is obtainable under the same conditions as used for producing copolymer (b1), in which case the production process for graft (b2) may be carried out in one or more steps. In two-stage grafting, for example, initially styrene, for example, alone and thereafter styrene and acrylonitrile are polymerizable in two successive steps.

This two-stage grafting (initially styrene, then styrene/acrylonitrile) is a preferred embodiment. Further details regarding the production of graft copolymers and/or impact modifiers (b) are described in German Laid-Open Specifications DOS 12 60 135 and 31 49 358.

It is advantageous for the graft polymerization on copolymer (b1) as graft substrate to be again carried out in aqueous emulsion. The graft polymerization may be carried out in the same system as the polymerization of the graft substrate, in which case emulsifier and initiator may further be admixed. These need not be identical to the emulsifiers and initiators, respectively, used for producing copolymer (b1). It may thus for example be advantageous to use a persulfate as initiator for producing copolymer (b1), but a redox initiator system for polymerizing the graft superstrate (b2). Otherwise the choice of emulsifier, initiator and polymerization assistants is subject to the remarks made in connection with producing copolymer (b1). The monomer mixture to be grafted onto the substrate may be admixed to the reaction mixture all at once, batchwise in two or more stages or preferably in a continuous manner during the polymerization.

In a particularly preferred embodiment, a reducing agent is added during the grafting of the copolymer (b1) substrate with monomers (b21) to (b23).

Insofar as ungrafted polymers are formed from monomers (b21) to (b23) in the course of the grafting of copolymer (b1), the amounts, which are generally below 10 wt % of (b2), are assigned to the mass of impact modifier (b).

In a further preferred embodiment, impact modifier (b) is obtainable by bulk polymerization as described for example in "Modern Styrenic Polymers: Polystyrenes and Styrenic Copolymers" (eds., J. Scheirs, D. Priddy, Wiley, Chichester, UK, (2003), pages 29 and 305 ff).

Process for Optimizing the Degree of Crosslinking

The process which the invention provides for optimizing the degree of crosslinking (V) of a crosslinked polymer (b1) as graft substrate for a polymeric impact modifier (b) comprises the steps of:
 (i) polymerizing the monomer mixture for producing said copolymer (b1);
 (ii) determining via NMR relaxation measurements the degree of crosslinking (V) of said copolymer (b1) obtained in step (i);
 (iii) polymerizing a modified monomer mixture to produce a modified copolymer (b1'), wherein the parameters of the polymerization reaction are adapted according to said degree of crosslinking (V) determined as per step (ii) for said copolymer (b1) and according to the desired degree of crosslinking (V') of said copolymer (b1') as graft substrate; and
 (iv) repeating said steps (i) to (iii) as often as necessary until a desired degree of crosslinking (V') is obtained.

Regarding impact modifier (b), copolymer (b1) and graft superstrate (b2), the above remarks apply.

Step (i) of the process comprises producing copolymer (b1) by polymerizing a defined mixture of monomers. The above remarks regarding this polymerization step and the selection and quantity of monomers and also other indications made all apply mutatis mutandis.

Step (ii) of the process relates to determining via NMR relaxation measurements the degree of crosslinking of said copolymer (b1) obtained in step (i).

Nuclear spin relaxation is described by the longitudinal relaxation time (spin-lattice relaxation time) T1, which characterizes the return of an excited nuclear spin system to thermal equilibrium, and by the transversal relaxation time (spin-spin relaxation time) T2, which describes for how long after an NMR excitation a signal is detectable.

Both the relaxation times depend in a characteristic manner on the local mobility of the molecular surroundings of the nuclear spin which is describable using a correlation time τ. The dependence of the transversal relaxation time of the molecular mobility is monotonal, and hence may be deemed a kind of qualitative rheometer. The use of the transversal relaxation time T2 is therefore preferable.

The greater the crosslinking of a certain network, the lower its T2 times. Customary T2 times for the subject invention graft substrates (b1) are T2 times in the range 2.0 to 7 ms, preferably 2.5 to 6.0 ms and more preferably 3.0 to 5.5 ms, as measured on filmed samples at 140° C.

NMR spectrometers are useful for measuring the transversal relaxation times T2. Instruments having field strengths of 0.001 to 15 teslas are usable. Preference is given to NMR instruments in the low-field range with field strengths from 0.001 to 1.5 teslas, especially 0.1 to 0.6 tesla. These instruments are small, robust and inexpensive. Analytically relevant information is derivable from the nuclear spin relaxation times and also from the related signal amplitudes. Since the relaxation times are determined by analyzing the NMR signals in the time domain instead of as with NMR spectroscopy in the frequency domain, this is also known as time domain NMR (TD-NMR).

The relaxation time can be measured by testing samples of copolymer (b1), samples of impact modifier (b) or samples of polymer composition (A). The degree of crosslinking is preferably determined on the impact modifier (b) or the polymer composition (A), especially on the impact modifier (b).

The T2 time is determined by measuring the NMR relaxation of a dewatered and filmed sample or of a sample in the form of a liquid dispersion of polymer. To measure a filmed sample, for example, the sample is devolatilized overnight and then for example vacuum dried at 80° C. for 3 h before being measured with a suitable measuring instrument, for example a minispec from Bruker, at 20° C. to 150° C., preferably at 30° C. to 140° C.

The sample may also be taken directly from the reaction mixture, and measured as a liquid dispersion of polymer, without further sample preparation.

Said measurement may utilize what is known as the solid echo Carr-Purcell-Meiboom-Gill sequence (SE-CPMG). Further information regarding this method is for example found in: N. Nestle, K. Häberle, Analytica Chimica Acta 654 (2009) 35-39. SE-CPMG is a method where pulsed NMR is used for determining the spin-spin relaxation time T2. In this method, spin echoes are generated at relatively short intervals. Time intervals of 80 μs to 200 μs are preferable. Advantages to this approach include, firstly, its quickness, since the entire transversal magnetization decay is read off with a single excitation event and, secondly, its relatively low sensitivity to diffusion effects in liquid phase. In the CPMG method, the diffusion-based error is only linearly dependent on time and minimizable by short intervals between pulses. SE-CPMG experiments are preferably carried out on liquid dispersions of graft substrate (b1) polymer and at 20° C. to 50° C., especially at 25° C. to 40° C.

Filmed samples can be investigated using the Hahn echo experiments and solid state echo experiments known to a person skilled in the art. The Hahn echo experiment (or spin echo experiment) is carried out using the pulse sequence 90°-τ-180°-τ-echo, where τ is the time interval between the pulses. In the solid state echo experiment, a sequence of two 90° pulses oriented perpendicularly to each other are used to generate an echo, refocusing the influence of the mutual magnetic dipole-dipole interaction of the nuclei in a solid state body. The NMR measurements on filmed samples are carried out at 20° C. to 150° C., preferably at 30° C. to 140° C.

For samples to be comparable they have to have been prepared and measured by the same method, since the relaxation is distinctly dependent on the measuring conditions, for example the temperature, and the manner of sample preparation.

The degree of crosslinking (V) of copolymer (b1) is preferably determined via measurements of the transversal relaxation times T2.

The measurements are specifically carried out via low-field NMR spectroscopy at field strengths of 0.001 to 1.5 teslas. Field strengths of 0.1 to 0.6 tesla are particularly preferable.

These can be carried out not only on liquid dispersions of polymer but also on solid samples of polymer, for example in the form of polymer films. Especially the SE-CPMG method is the preferred method of measuring polymer dispersions. Polymer films are preferably investigated with a Hahn echo or solid state echo experiment.

In the process of the present invention, the degree of crosslinking (V) of copolymer (b1) is determined in order thus to adapt the reaction conditions of the polymerization reaction for producing copolymer (b1) to the desired degree of crosslinking. This is accomplished by a modified monomer mixture being polymerized in step (iii) of the process to produce a modified copolymer (b1'). This modified monomer mixture differs from the first monomer mixture in that the composition is varied. More particularly, the amounts of additional crosslinking monomer (b13) and of chain transfer agent (b14) are varied.

Further, the parameters of the polymerization reaction are adapted according to said degree of crosslinking (V) determined as per step (ii) for said copolymer (b1) and according to the desired degree of crosslinking (V') of said copolymer (b1') as graft substrate. This may be accomplished by changing the reaction temperature and duration, the ratio of monomers, regulators and free-radical initiators and, in the feed stream addition process for example, by changing the feed stream addition rate and the amount and timing for admixture of regulator and initiator. More particularly, the reaction is controlled by the admixture of crosslinking agents or chain transfer agents.

Crosslinking agents for controlling the degree of crosslinking in the present invention are the polyfunctional monomers (b13) (crosslinking monomers). Examples thereof are monomers containing two or more copolymerization-capable double bonds such as ethylene glycol diacrylate, butanediol diacrylate, hexanediol diacrylate, ethylene glycol dimethacrylate, butanediol dimethacrylate, hexanediol dimethacrylate, divinylbenzene, diallyl maleate, diallyl fumarate, diallyl phthalate, diallyl cyanurate, trisallyl cyanurate, esters of tricyclodecenyl alcohol such as tricyclodecenyl acrylate, dihydrodicyclopentadienyl acrylate, diallyl phosphate, allyl acrylate, allyl methacrylate and dicyclopentadienyl acrylate (DCPA).

Preference is given to using esters of tricyclodecenyl alcohol, divinylbenzene, allyl (meth)acrylate and/or trisallyl cyanurate.

These are suitable in particular for controlling the degree of crosslinking of acrylic polymers, especially of acrylonitrile-styrene-acrylate copolymers (ASA).

Chain transfer agents in accordance with the present invention include, for example, ethylhexyl thioglycolate, n-dodecyl mercaptan, tert-dodecyl mercaptan or other mercaptans, terpinols and dimeric α-methylstyrene and other compounds suitable for regulating the molecular weight. Ethylhexyl thioglycolate, n-dodecyl mercaptan and t-dodecyl mercaptan are particularly suitable. They are suitable in particular for controlling the degree of crosslinking of diene polymers, especially of acrylonitrile-butadiene-styrene copolymers (ABS).

The invention also provides a process wherein the step of providing said copolymer (b1') according to said degree of crosslinking determined in step (ii) for said copolymer (b1) resulting from the first polymerization reaction is carried out by admixing the reaction mixture of the polymerization mixture as per step (iii) additionally with a polyfunctional crosslinking monomer (b13) as crosslinking agent and/or a chain transfer agent (b14), or changing the reaction temperature in the polymerization reaction, or a combination thereof.

The temperature change here preferably amounts to not less than 10° C., especially not less than 15° C.

The admixture of crosslinking agent (b13) and/or of chain transfer agent (b14) can be effected alone or in combination with each other. Suitable crosslinking agents (b13) and chain transfer agent (b14) are those referred to above.

The invention also provides a process wherein, in step (iii), the reaction mixture has added to it a chain transfer agent in a concentration of 0.1 to 0.6 wt %, based on the entire monomer quantity of the polymerization mixture for producing said copolymer (b1').

Following this second polymerization as per step (iii), the degree of crosslinking (V) of copolymer (b1') obtained in step (ii) is determined. This may again be investigated on samples of copolymer (b1'), samples of impact modifier (b') containing this copolymer (b1'), or samples of polymer composition (A') produced therefrom. The degree of crosslinking is preferred on the impact modifier (b') or the polymer composition (A'), especially on the impact modifier (b'). The measurement is carried out as described above.

When the results of the investigation show that the resultant degree of crosslinking (V) does not correspond to the desired degree of crosslinking (V'), steps (i) to (iii) are repeated as often as desired until a desired degree of crosslinking (V') is obtained.

Production of Polymer Composition (A)

Polymer composition (A) according to the present invention is obtainable from components (a) and (b) by any known method. The polymer composition (A) may optionally be admixed with additives (C). These are more particularly described hereinbelow. The polymer composition is produced in detail as follows:

The impact modifiers (b) having an optimized degree of crosslinking are produced by the process described, preferably via emulsion polymerization. The degree of crosslinking, as already described, is established by suitable measures. The preference here is for determining the degree of crosslinking (V) by measuring the transversal relaxation time T2 in low-field NMR experiments and for regulating the degree of crosslinking by the admixture of chain transfer agents. Other suitable measures familiar to a person skilled in the art may also be taken instead or in combination in order to establish the degree of crosslinking.

The resulting dispersion of impact modifiers (b) may either be mixed directly with components (a) and optionally (C), or worked up beforehand.

The workup of the dispersion of impact modifiers (b) is effected in a conventional manner. Typically, the first step is to precipitate the impact modifier (b) out of the dispersion, for example by admixture of precipitatingly effective salt solutions (such as calcium chloride, magnesium sulfate, alum) or acids (such as acetic acid, hydrochloric acid or sulfuric acid) or else by freezing (freeze coagulation). The aqueous phase may be separated off in a conventional manner, as for instance by sieving, filtration, decantation or centrifugation. This prior removal of the dispersion water yields water-moist impact modifiers (b) having a residual water content of up to 60 wt %, based on (b), wherein the residual water may be for example not only externally adherent on impact modifier (b) but also encapsulated therein.

The impact modifier (b) may thereafter if necessary be further dried in a known manner, for example with hot air or via a stream dryer. It is similarly possible to work up the dispersion by spray drying. The impact modifiers (b) are mixed with the styrene copolymer (a) and, if present, the further additives (C) in a mixing apparatus to form an essentially molten polymer composition.

"Essentially molten" is to be understood as meaning that the polymer composition in addition to the predominant, molten (softened) fraction may further contain a certain proportion of solid constituents, for example unmelted filling and reinforcing materials such as glass fibers, metal flakes, or else unmelted pigments, dyes, etc. "Molten" is to be understood as meaning that the polymer composition is at least viscid, i.e., at least softened to the point of being plastically deformable.

Mixing apparatus used is known to a person skilled in the art. Conjoint extrusion, kneading or rolling are examples of possible ways to mix components (a) and (b) and, —if present—(C), for which the aforementioned components have, if necessary, first been isolated from the as-polymerized solution or from the aqueous dispersion.

When one or more components are incorporated in the form of an aqueous dispersion or in the form of an aqueous or nonaqueous solution, the water or, respectively, the solvent is removed from the mixing apparatus, preferably an extruder, via a devolatilizing unit.

Suitable mixing apparatus for carrying out the process includes, for example, heated batch-operated internal mixers with or without ram, continuous kneaders such as, for example, continuous internal mixers, screw kneaders with axially oscillating screws, Banbury mixers, further extruders and also roll mills, heated mixing rolls, and calenders.

An extruder is preferred for use as the mixing apparatus. Single- or twin-screw extruders for example are particularly useful for melt extrusion. A twin-screw extruder is preferable.

In some cases, the mechanical energy imported by the mixing apparatus during the mixing process is in itself sufficient to cause the mixture to melt, so there is no need to heat the mixing apparatus. Otherwise, the mixing apparatus is generally heated. The temperature depends on the chemical and physical properties of components (a) and (b) and—if present—(C), and must be chosen so as to obtain an essentially molten polymer composition. On the other hand, the temperature must not be unnecessarily high, to avoid thermal injury to the polymer composition. However, the mechanical energy imported may also be high enough for the mixing apparatus to possibly even require cooling. The mixing apparatus is typically operated at 160 to 400, preferably 180 to 300° C.

A preferred embodiment comprises mixing the impact modifier (b) with the styrene copolymer (a) and, if present, the further component (C) in an extruder, the dispersion of impact modifier (b) being metered into the extruder directly without prior removal of the dispersion water. The water is typically removed along the extruder via suitable devolatilizing devices. Useful devolatilizing devices include, for example, devolatilizing openings provided retention screws (to prevent the polymer composition from escaping).

Another, similarly preferred embodiment comprises mixing the aforementioned components in an extruder while the impact modifier (b) is separated beforehand from the dispersion water. This prior removal of the dispersion water yields water-moist impact modifiers (b) having a residual water content of up to 60 wt %, based on (b). The residual water present may then, as described above, be removed as vapor via devolatilizing means of the extruder.

It is particularly preferred, however, not to remove the residual water in the extruder solely as vapor; instead some of the residual water is mechanically removed in the extruder and leaves the extruder in liquid phase. In this so-called squeeze process (EP 0 993 476 B1, pages 13-16), one and the same extruder is supplied with the polymer composition (A) and—if present—the component (C), so the final polymer composition (A) is extruded as the product of the process.

The subject invention polymer composition (A) has a residual monomer content of not more than 2000 ppm, preferably not more than 1000 ppm, more preferably not more than 500 ppm. Residual monomer content refers to the proportion of the polymer composition that is attributable to unconverted (unpolymerized) monomer.

The subject invention polymer composition (A) further has a solvent content of, for example, ethylbenzene, toluene, etc. at not more than 1000 ppm, preferably not more than 500 ppm, more preferably not more than 200 ppm.

The low solvent and residual monomer content is obtainable by employing customary processes for reducing solvents and residual monomers out of polymer melts, as described for example in Kunststoffhandbuch, eds. R. Vieweg and G. Daumiller, volume 4 "Polystyrol", Carl-Hanser-Verlag Munich (1996), pages 121 to 139. These processes utilize typical devolatilization apparatus such as, for example, partial vaporizers, flat evaporators, strand devolatilizers, thin film evaporators, devolatilization extruders, etc.

Polymer composition (A) further contains not more than 500 ppm, preferably not more than 400 ppm and more preferably not more than 300 ppm of transition metals such as, for example, Fe, Mn and Zn.

Polymer compositions (A) having such a low transition metal content are obtainable for example by initiating the polymerization of the polymers present in the polymer composition by employing redox initiators, but using these redox initiators in minimal amounts in combination with peroxides. Polymer composition (A) should therefore further contain but minimal amounts of transition metal-containing minerals (e.g., pigments).

The viscosity of the entire polymer composition (A) at shear rates of 1 to 10 $s^{-1}$ and at temperatures of 250° C. is not more than $1 \times 10^5$ Pa*s, preferably not more than $1 \times 10^4$ Pa*s and more preferably not more than $1 \times 10^3$ Pa*s.

The melt volume rate (MVR, measured to ISO 1133 at 220° C. and 10 kg load) is generally more than 6 ml/10 min, preferably more than 8 ml/10 min and more preferably more than 12 ml/10 min.

Polymer composition (A) is very useful in the manufacture of thermoplastic molding compounds that are further processable into moldings, sheetings or coatings. A polymer composition (A) used for this purpose optionally has further added to it one or more further polymers (B) and optionally additives (C).

The proportion of the molding compound that is attributable to polymer composition (A) is generally in the range from 40 to 100 wt %, preferably in the range from 70 to 100 wt % and most preferably in the range from 80 to 100 wt %, based on the entire molding compound.

The molding compound may optionally further contain at least one further polymer (B) (other than (A)) selected from the group: polycarbonates, polyamides, poly(meth)-acrylates, polyesters and vinylaromatic-diene copolymers (SBCs). Preference for use as polymer (B) is given to polycarbonates, polyamides and/or poly(meth)acrylates. The proportion of polymer (B) is generally in the range from 0 to 60 wt %, preferably in the range from 0 to 30 wt % and more preferably in the range from 0 to 20 wt %, based on the entire molding compound. Polymer (B), if at all, is typically present in the molding compound at a minimum fraction of 0.1 wt %.

The molding compound may optionally further contain customary additives (C), such as stabilizers, antioxidants, agents against thermal decomposition and decomposition by ultraviolet light, lubricating and demolding agents, colorants such as dyes and pigments, fibrous and pulverulent filling and reinforcing agents, nucleating agents, plasticizers, etc. The proportion of additives (C) is generally in the range from 0 to 50 wt %, preferably in the range from 0 to 30, often 0.1 to 30, more preferably 0.2 to 10 wt %, based on the entire molding compound.

Additives (C), if at all, are typically present in the molding compound at a minimum fraction of 0.1 wt %. The sum total of components (A) and optionally (B) and/or (C) present in the entire molding compound adds up to 100 wt %. A molding compound of the present invention preferably does contain components (A), (B) and (C) or consist thereof.

When the molding compound contains minerals such as fibrous and pulverulent filling and reinforcing agents and/or pigments as additive (C) in but minimal amounts, if at all (i.e., at from 0 to 5 wt %, based on the entire molding compound), the proportions of polymer composition (A) that are attributable to polymer (a) and impact modifier (b) are preferably in the range from 70 to 95 wt % and from 5 to 30 wt %, respectively.

The molding compound used further preferably contains essentially amorphous polymers, i.e., at least half the polymers present in the molding compound are amorphous polymers.

The invention is more particularly elucidated by the following examples and claims:

EXAMPLES

First, the test methods used to characterize the polymers are briefly summarized:

a) Rubber Content

The rubber content of the copolymers obtained was determined via IR spectroscopy. To this end, the final rubber content is computed from the measured ratio of butadiene to styrene to acrylonitrile (each in polymeric form). To this end, a film about 20 μm in layer thickness is prepared in a press at 180° C. and measured IR spectroscopically in transmission. The absorptions of the bands at 910 cm$^{-1}$ and 965 cm$^{-1}$ for the 1,2-vinyl and 1,4-trans-polybutadiene units, the absorption of the band at 2238 cm$^{-1}$ for the nitrile group of the polymerized acrylonitrile and the absorption of the band at 1495 cm$^{-1}$ for the phenyl group of the polymerized styrene are enlisted to compute the ratio by using a calibration with samples of known composition.

b) Charpy Notched Impact Strength [kJ/m$^2$]:

The notched impact strength is determined to ISO 179-1A at 23° C. on sample pieces (80×10×4 mm, prepared by injection molding at a melt temperature of 240° C. and a mold temperature of 70° C.).

c) Flowability (MVR [ml/10 min]):

The flowability is determined to ISO 1133 on a polymer melt at 220° C. and 10 kg loading.

d) Surface Gloss

To determine surface gloss, an injection molding machine is used at a melt temperature of 240° C. and a mold temperature of 70° C. to produce rectangular plaques on the polymer melt which measure 60 mm×40 mm×2 mm. The surface gloss is measured by reflection measurement to DIN 67530 at an angle of 20°.

e) Yellowness Index YI

The YI value was determined on plaques measuring 60×40×2 mm, prepared by injection molding at a melt temperature of 240° C. and a mold temperature of 70° C., using ASTM method E313-96 (illuminant/observer combination)(C)/2°).

Example 1

Production of copolymer (b1) in the manner of the present invention

Copolymer (b1) is produced by emulsion polymerization according to the feed stream addition process. Butadiene is used as monomer, and 7 wt % of styrene as comonomer. The emulsion polymerization is carried out in a 150 L reactor at a temperature of 67° C. 43 120 g of the monomer mixture (butadiene and styrene) are polymerized at 67° C. in the presence of 229.8 g (0.533 part based on the entire monomer quantity) of tert-dodecyl mercaptan (TDM), 320.8 g of potassium stearate, 106.1 g of potassium persulfate, 151.4 g of sodium dicarbonate and 58 400 g of water to obtain a latex of the graft substrate at a 42.1 wt % solids content.

The monomers are introduced into the reactor in the following sequence:

Styrene is admixed first in an amount of 7 wt %, based on the entire monomer quantity, in the course of 20 minutes. The styrene admixture is followed by the admixture of 0.527 wt % of styrene and 6.473 wt % of butadiene, based on the entire monomer quantity, in the course of 25 minutes.

The rest of the monomers, which corresponds to 86 wt %, based on the entire monomer quantity, and consists of 6.473 wt % of styrene and 79.527 wt % of butadiene, is subsequently admixed in the course of 8.5 hours. TDM is injected at 71 minutes (41.7% of total TDM), at 260 minutes (41.7% of the total) and at 500 minutes (16.6% of total TDM). The conversion at the end of the polymerization time is 95%.

Determination of the Degree of Crosslinking

The copolymer latices produced according to the invention are sampled in various test series. The samples are air dried overnight and vacuum redried at 80° C. for 3 hours to obtain filmed samples. These are examined at 30° C. and 140° C. by a standard method using solid state echo and Hahn echo. The relaxation times measured range from 1.28 ms to 1.72 ms for T2 (30° C.) and from 3.96 ms to 5.00 ms for T2 (140° C.). The degree of crosslinking is determined from the T2 relaxation times measured.

Production of Impact Modifier (b)

General Procedure:

First, 59 parts by weight of graft substrate (b1) latex, based on the solids content of the latex, are initially charged at a temperature of 68° C. and stirred. 1.357 parts by weight of a latex (based on latex solids) of an agglomeratingly effective copolymer formed from 96 wt % of ethyl acrylate and 4 wt % of methacrylamide are adjusted to 10 wt % with demineralized water.

This dilute latex is admixed to graft substrate (b1) under agitation in the course of 25 minutes for agglomeration. After 5 minutes, 0.56 part by weight of potassium stearate, dissolved in 40.98 parts by weight of demineralized water at 68° C., is added to the latex of graft substrate (b1) under continued agitation.

On completion of the agglomerating step, 0.074 part by weight of potassium persulfate, dissolved in 3.13 parts by weight of demineralized water, is added to the agglomerated latex of graft substrate (b1) at 68° C. under continued agitation. A monomer mixture of 32.8 parts by weight of styrene and 8.2 parts by weight of acrylonitrile is admixed in the course of 2 hours and 44 minutes under continued agitation. In the course of this period of adding the styrene-acrylonitrile mixture, the temperature is raised to 80° C. On completion of the addition of the styrene-acrylonitrile mixture, 0.074 part by weight of potassium persulfate dissolved in 3.13 parts by weight of demineralized water is added under continued agitation. The polymerization is continued for 80 minutes at 80° C. and the resultant latex of graft copolymer (b) is cooled down to ambient temperature.

The graft latex obtained is admixed with 0.37 part by weight of a dispersion of a stabilizer (based on dispersion solids, the dispersion having a solids content of 60 wt %). Thereafter, the dispersion of the graft copolymer is precipitated with an aqueous solution of a precipitant in a steam-heated stirred precipitation tank at 4 bar and a temperature of 88° C. This is done by initially charging the aqueous solution of the precipitant to the steam-heated precipitation tank and gradually metering in the dispersion of the graft copolymer under agitation once a temperature of 88° C. is reached.

Thereafter, the precipitation suspension is transferred into a steam-heated stirred sintering tank. Sintering is effected at 4 bar and 116° C. for 60 minutes. Subsequently, the sintered graft copolymer is spun in a centrifuge and washed twice with 550 parts by weight of demineralized water. The polymer thus worked up is further processed via extrusion at a residual moisture content of 15 to 30%.

Comparative Example 1

Production of Comparative Copolymer (V-b1) by Conventional Process

Comparative copolymer (V-b1) is produced by emulsion polymerization in the feed stream addition process as described in Example 1. The difference is that 345.4 g (0.801 part based on entire monomer quantity) are used of tert-dodecyl mercaptan (TDM).

Production of Comparative Impact Modifier (V-b)

Comparative impact modifier (V-b) was produced according to the protocol for producing invention impact modifier (b) except that comparative impact modifier (V-b1) was used as graft substrate.

Example 2

Production of Polymer Composition (A) from SAN Copolymer (a) and Impact Modifier (b)

Impact modifier (b) was used to produce polymer compositions (A1) to (A5). To this end, impact modifier (b) is mixed in a twin-screw extruder having a screw diameter of 25 mm with styrene copolymer (a) in the proportions (based on the entire polymer composition) reported in table 1 by addition of 1 wt % of the hereinbelow described stabilizer masterbatch. The temperature in the extrusion zone is set at 200 to 250° C. and the processing speed of the twin-screw extruder was 700 rpm. The batch size is 4 kg for all examples.

The styrene copolymer chosen as styrene copolymer (a) is a random copolymer formed from styrene and acrylonitrile (an SAN copolymer) and having an acrylonitrile content of 24 wt %, an Mw of 120 000 g/mol, a viscosity number of 64 ml/g (concentration 5 g/l in dimethylformamide measured at 20° C.) and an MVR melt volume rate of 64 ml/10 min, measured to ISO 1133 at 220° C. and 10 kg loading.

The stabilizer masterbatch is a masterbatch featuring thermal and light stabilizers such as, for example, Tinuvin 770, Cyasorb 3853, Chimasorb 944 in SAN polymer (Luran VLN).

TABLE 1

| Polymer composition (A) | Amount used of impact modifier (b) in wt % | Amount used of SAN polymer (a) in wt % | Amount used of stabilizer masterbatch in wt % |
|---|---|---|---|
| A1 | 29 | 80 | 1 |
| A2 | 31 | 78 | 1 |
| A3 | 33 | 76 | 1 |
| A4 | 35 | 74 | 1 |
| A5 | 37 | 72 | 1 |

The ABS compositions obtained were tested to determine their Charpy notched impact strength, flowability (MVR), yellowness index (YI) and surface gloss. This was done using the test methods described above.

The rubber content of the samples was determined by performing the IR measurements described at the beginning on the granular materials obtained.

Table 2 summarizes the test results of the ABS compositions tested.

Comparative Example 2

Comparative polymer compositions V-A1 to V-A5 solely differ from invention polymer compositions A1 to A5 in that comparative impact modifier (V-b) is used for producing the comparative molding compounds.

The ABS compositions obtained were tested to determine their Charpy notched impact strength, flowability (MVR), yellowness index (YI) and surface gloss. This was done using the test methods described above.

The rubber content of the samples was determined by performing the IR measurements described at the beginning on the granular materials obtained.

Table 2 summarizes the test results of the ABS compositions tested.

TABLE 2

| | Rubber content [%] | Charpy [kJ/m$^2$] | MVR [ml/10 min] | Yellowness Index | Surface gloss at 20° |
|---|---|---|---|---|---|
| V-A1 | 30.0 | 11 | 16.5 | 34.58 | 97.3 |
| V-A2 | 31.4 | 12.8 | 15.3 | 34.74 | 94.1 |
| V-A3 | 33.0 | 15.4 | 13.1 | 35.82 | 92 |
| V-A4 | 35.6 | 18.3 | 11.2 | 34.89 | 92.8 |
| V-A5 | 36.2 | 20.7 | 9.2 | 36.7 | 92.1 |
| A1 | 27.4 | 11.6 | 21 | 34.2 | 95.8 |
| A2 | 29.2 | 14 | 17.6 | 35.8 | 94.4 |

TABLE 2-continued

| | Rubber content [%] | Charpy [kJ/m$^2$] | MVR [ml/10 min] | Yellowness Index | Surface gloss at 20° |
|---|---|---|---|---|---|
| A3 | 32.2 | 16.5 | 16.5 | 36.7 | 94.8 |
| A4 | 32.8 | 17.6 | 14 | 37.1 | 95.1 |
| A5 | 33.8 | 21 | 11.6 | 36.5 | 94.1 |

The results show that polymer compositions produced by the process of the invention have distinctly better mechanical properties. This is attributable to the improved crosslinking of the rubber component, this improved crosslinking being the result of the present process, which makes it possible to reduce the amount of chain transfer agent used. The process of the invention has no noticeable adverse effects on the other polymer properties referred to.

The process of the invention provides improved properties of impact modified polymer compositions while at the same time reducing the addition of costly and potentially harmful and/or environmentally damaging substances to the polymer composition.

Example 3

80% of polymer composition A1 is mixed with 20% of polycarbonate (based on bisphenol A) in a twin-screw extruder having a screw diameter of 25 mm. The temperature in the extrusion zone is set at 200 to 250° C. and the processing speed of the twin-screw extruder was 700 rpm. The polymer blend is used to produce a shaped article.

We claim:

1. A process for optimizing the degree of crosslinking (V) of a crosslinked copolymer (b1) until a desired degree of crosslinking (V') is obtained for a crosslinked copolymer (b1') as graft substrate for a polymeric impact modifier (b), wherein said copolymers (b1) and (b1'), independently of one another, are produced from a monomer mixture comprising:

(b11): 70 to 99.99 wt % of at least one conjugated diene and/or of at least one acrylate,
(b12): 0 to 29 wt % of at least one further comonomer selected from: styrene, α-methylstyrene, acrylonitrile, methacrylonitrile, and methyl methacrylate,
(b13): 0 to 10 wt % of one or more polyfunctional crosslinking monomers, and
(b14): 0.01 to 0.7 wt % of a chain transfer agent,
based on the entire monomer quantity of the polymerization mixture for producing said copolymer (b1) or (b1');

wherein the process comprises the steps of:

(i) polymerizing the monomer mixture for producing said copolymer (b1);
(ii) determining via NMR relaxation measurements the degree of crosslinking (V) of said copolymer (b1) obtained in step (i);
(iii) polymerizing a modified monomer mixture to produce a modified copolymer (b1'), wherein the parameters of the polymerization reaction are adapted according to said crosslinking (V) determined as per step (ii) for said copolymer (b1) and according to the desired crosslinking (V') of said copolymer (b1') as graft substrate as determined via NMR relaxation measurements; and
(iv) repeating said steps (i) to (iii) as often as necessary until a desired degree of crosslinking (V') is obtained for said crosslinked copolymer (b1') as graft substrate for said polymeric impact modifier (b), and wherein the transversal relaxation time T2 is used to determine said degree of crosslinking (V) and (V') of said copolymers (b1) and (b1'), said degree of crosslinking (V) and (V') of said copolymers (b1) and (b1') is determined by using a low-field NMR spectrometer at a field strength ranging from 0.001 to 1.5 teslas, and the desired degree of crosslinking (V') for said crosslinked copolymer (b1') as graft substrate for said polymeric impact modifier (b) ranges from 2.0 to 7 ms T2 times, as measured on filmed samples at 140° C.

2. The process as claimed in claim 1, characterized in that the step of providing said copolymer (b1') according to said degree of crosslinking (V) determined in step (ii) for said copolymer (b1) resulting from the first polymerization reaction is carried out by admixing the reaction mixture of the polymerization mixture as per step (iii) additionally with a polyfunctional crosslinking monomer (b13) as crosslinking agent and/or a chain transfer agent (b14), or changing the reaction temperature in the polymerization reaction, or a combination thereof.

3. The process as claimed in claim 1, characterized in that the step of providing said copolymer (b1') is carried out by subjecting the reaction mixture of the polymerization reaction to a temperature change by not less than 10° C.

4. The process as claimed in claim 1, characterized in that the reaction mixture has added to it a chain transfer agent in an amount of 0.1 to 0.6 wt %, based on the entire monomer quantity of the polymerization mixture for producing said copolymer (b1').

5. A method of using the process as claimed in claim 1 in the manufacture of a copolymer (b1') having an optimized degree of crosslinking (V') as graft substrate for said polymeric impact modifier (b).

6. The process as claimed in claim 1, wherein the degree of crosslinking (V) and (V') of said copolymers (b1) and (b1') is determined by using a low-field NMR spectrometer at a field strength ranging from 0.1 to 0.6 tesla.

* * * * *